(12) United States Patent
Inaba

(10) Patent No.: US 10,186,494 B2
(45) Date of Patent: Jan. 22, 2019

(54) ELECTRONIC COMPONENT

(71) Applicant: E I DU PONT DE NEMOURS AND COMPANY, Wilmington, DE (US)

(72) Inventor: Akira Inaba, Kawasaki (JP)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 37 days.

(21) Appl. No.: 15/647,789

(22) Filed: Jul. 12, 2017

(65) Prior Publication Data

US 2017/0309591 A1    Oct. 26, 2017

Related U.S. Application Data

(62) Division of application No. 14/660,203, filed on Mar. 17, 2015, now abandoned.

(51) Int. Cl.
| | |
|---|---|
| *H01L 23/00* | (2006.01) |
| *H01G 4/30* | (2006.01) |
| *H01G 4/232* | (2006.01) |
| *H01G 2/06* | (2006.01) |
| *B05D 3/00* | (2006.01) |

(Continued)

(52) U.S. Cl.
CPC ............ *H01L 24/32* (2013.01); *B05D 3/007* (2013.01); *B05D 7/14* (2013.01); *H01C 1/14* (2013.01); *H01F 27/29* (2013.01); *H01G 2/065* (2013.01); *H01G 4/232* (2013.01); *H01G 4/2325* (2013.01); *H01G 4/248* (2013.01); *H01G 4/30* (2013.01); *H01L 24/83* (2013.01); *H01L 2224/3223* (2013.01); *H01L 2224/83851* (2013.01); *H01L 2924/0103* (2013.01); *H01L 2924/014* (2013.01); *H01L 2924/0105* (2013.01); *H01L 2924/01013* (2013.01); *H01L 2924/01028* (2013.01); *H01L 2924/01029* (2013.01); *H01L 2924/01031* (2013.01); *H01L 2924/01045* (2013.01); *H01L 2924/01046* (2013.01); *H01L 2924/01047* (2013.01); *H01L 2924/01049* (2013.01); *H01L 2924/01079* (2013.01); *H01L 2924/01083* (2013.01);

(Continued)

(58) Field of Classification Search
CPC ........ H01L 24/32; H01G 4/248; H01G 4/232; H01G 4/2325; H01C 1/14
See application file for complete search history.

(56) References Cited

U.S. PATENT DOCUMENTS

| | | | |
|---|---|---|---|
| 5,354,918 | A | 10/1994 | Ohsaki et al. |
| 6,090,314 | A | 7/2000 | Handa et al. |

(Continued)

FOREIGN PATENT DOCUMENTS

| | | | |
|---|---|---|---|
| EP | 0450278 | A1 | 10/1991 |
| EP | 0720187 | A1 | 7/1996 |

(Continued)

OTHER PUBLICATIONS

PCT International Search Report for Application No. PCT/US2016/022633; Christophe Dessaux, Authorized Officer; ISA/EPO; dated Jun. 15, 2016.

*Primary Examiner* — David M Sinclair

(57) ABSTRACT

An electric component comprising a terminal electrode and a hot-melt polymer layer formed on the terminal electrode, wherein the hot-melt polymer layer comprises (i) 100 parts by weight of a metal powder and (ii) 1 to 30 parts by weight of a polymer, wherein melt mass-flow rate (MFR) of the polymer is 0.5 to 20 g/10 min. at 120 to 200° C. and 0.3 to 8 kgf.

12 Claims, 1 Drawing Sheet

(51) Int. Cl.
*B05D 7/14* (2006.01)
*H01C 1/14* (2006.01)
*H01F 27/29* (2006.01)
*H01G 4/248* (2006.01)

(52) U.S. Cl.
CPC .............. *H01L 2924/1205* (2013.01); *H01L 2924/1206* (2013.01); *H01L 2924/1207* (2013.01)

(56) References Cited

U.S. PATENT DOCUMENTS

| | | |
|---|---|---|
| 6,238,599 B1 | 5/2001 | Gelorme et al. |
| 6,299,801 B1 | 10/2001 | Handa et al. |
| 6,814,795 B2 | 11/2004 | McVicker et al. |
| 7,151,306 B2 | 12/2006 | Kitae et al. |
| 2004/0240146 A1 | 12/2004 | Kayatani et al. |
| 2006/0145125 A1 | 7/2006 | Kuwajima et al. |
| 2009/0140210 A1 | 6/2009 | Toshioka et al. |
| 2009/0309220 A1 | 12/2009 | Katogi et al. |
| 2010/0231228 A1 | 9/2010 | Koelblin et al. |

FOREIGN PATENT DOCUMENTS

| | | |
|---|---|---|
| JP | 09-260822 A | 10/1997 |
| JP | 2005-120301 A | 5/2005 |
| JP | 2007-069259 A | 3/2007 |

ELECTRONIC COMPONENT

This application is a divisional application of Ser. No. 14/660,203 filed on Mar. 17, 2015.

FIELD OF THE INVENTION

The present invention relates an electric component and a method of manufacturing thereof.

TECHNICAL BACKGROUND OF THE INVENTION

Electric component is mounted on a circuit and jointed by a solder. The solder needs to spread out on a terminal electrode of the electric component.

EP0720187 discloses a multiple-layered capacitor having a terminal electrode that is made of a composition containing a silver particles and a glass frit.

BRIEF SUMMARY OF THE INVENTION

An objective is to provide an electric component having superior solderability.

An aspect of the invention relates to an electric component comprising a terminal electrode and a hot-melt polymer layer formed on the terminal electrode, wherein the hot-melt polymer layer comprises (i) 100 parts by weight of a metal powder and (ii) 1 to 30 parts by weight of a polymer, wherein melt mass-flow rate (MFR) of the polymer is 0.5 to 20 g/10 min. at 120 to 200° C. and 0.3 to 8 kgf.

Another aspect of the invention relates to a method of manufacturing an electric component comprising steps of: providing an electric component comprising a main body, wherein at least one terminal electrode is formed on the main body; applying a hot-melt polymer paste on the terminal electrode, wherein the hot-melt polymer paste comprises (i) 100 parts by weight of a metal powder, (ii) 1 to 30 parts by weight of a polymer and (iii) a solvent, wherein melt mass-flow rate (MFR) of the polymer is 0.5 to 15 g/10 min. at 120 to 200° C. and 0.3 to 8 kgf; and drying the applied hot-melt polymer paste.

Another aspect of the invention relates to an electric component comprising a terminal electrode and a hot-melt polymer layer formed on the terminal electrode, wherein the hot-melt polymer layer comprises (i) 100 parts by weight of a metal powder and (ii) 1 to 30 parts by weight of a polymer, wherein the polymer is selected from the group consisting of polyester resin, phenoxy resin, novolac resin, epoxy resin, acrylic resin, melamine resin, polyimide resin, polyamide resin, polystyrene resin, butyral resin, cellulose resin, polyvinyl alcohol, polyurethane resin, silicone resin and a mixture thereof.

An electric component having superior solderability can be provided by the present invention.

DETAILED DESCRIPTION OF INVENTION

An electric component and a method of soldering the electric component are explained below along FIG. 1 to FIG. 3.

Electric Component

Figure 1:
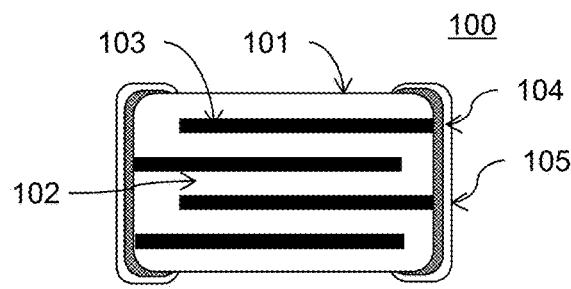
FIG. 1 is a schematic cross-sectional drawing of the electric component.

An electric component 100 as capacitor is shown in FIG. 1. The electric component 100 comprises a terminal electrode 104 and a hot-melt polymer layer 105 formed on the terminal electrode. The terminal electrode is defined as an electrode electrically and physically joined with an external conductive element such as a circuit. The capacitor in FIG. 1 comprises a main body 101 and the terminal electrodes 104 at both sides of the main body 101 and the hot-melt polymer layer 105 on both the terminal electrodes.

The main body 101 of the capacitor is a laminate consisting of ceramic layers 102 and internal electrode layers 103 in an embodiment.

The terminal electrode 104 can be a fired-type electrode or a cured-type electrode in an embodiment. The fired-type electrode can be formed by applying a conductive paste comprising typically a conductive powder, a glass frit and an organic vehicle; and firing the conductive paste in an embodiment. The cured-type electrode can be formed by applying a heat-curable conductive paste comprising a conductive powder and a thermosetting polymer; and heating the heat-curable conductive paste in another embodiment.

The conductive powder for the terminal electrode can be silver, copper, nickel or a mixture thereof in an embodiment.

The terminal electrode is 10 to 50 μm thick in an embodiment.

The hot-melt polymer layer 105 is formed on the terminal electrode 104. Hot-melt polymer layer is defined as being melted at a reflow temperature. Reflow is a process of melting a solder paste by heat to attach an electrical component to a circuit.

The hot-melt polymer layer 105 is formed by applying a hot-melt polymer paste such as dipping, screen printing and transfer printing on the terminal electrode 104 in an embodiment. The hot-melt polymer layer 105 comprises a metal powder and a polymer and a solvent. The applied hot-melt polymer paste is then dried out to remove the solvent. The drying temperature can be 50 to 200° C. in an embodiment, 60 to 180° C. in an embodiment, 90 to 160° C. in another embodiment.

The hot-melt polymer layer 105 can be formed on the entire surface of the terminal electrode 104 in an embodiment. The hot-melt polymer layer 105 can be partially formed on the terminal electrode 104 in another embodiment. The hot-melt polymer layer 105 can be formed on the terminal electrode at least at the area of contingence with a solder paste as being mounted thereon. At least 70% of the surface of the terminal electrode 104 can be covered with the hot-melt polymer layer 105 in another embodiment. The terminal electrode 104 can be entirely covered with the hot-melt polymer layer 105 in another embodiment.

The hot-melt polymer layer is 1 to 30 μm thick in an embodiment, 3 to 25 μm thick in another embodiment and 5 to 15 μm thick in another embodiment.

The hot-melt polymer layer comprises no glass frit in an embodiment.

The hot-melt polymer layer comprises no curing agent or cross-linking agent in an embodiment.

Figure 2:
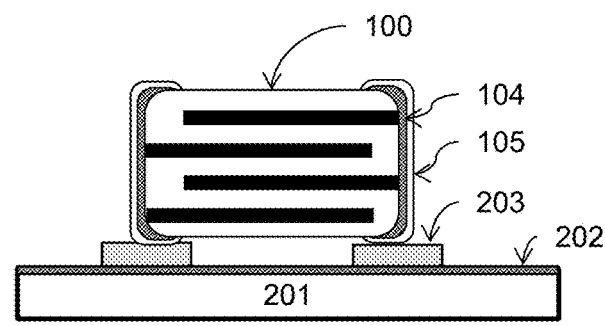
FIG. 2 is a schematic cross-sectional drawing for explaining the manufacturing method of an electrical device at the step of mounting an electric component on the substrate.

The electric component 100 is mounted on an electric circuit board in an embodiment as shown in FIG. 2.

A substrate 201 having a circuit 202 on its surface is prepared. The substrate 201 can be rigid or flexible in an embodiment. The substrate 201 can be a paper phenol substrate, a paper epoxy substrate, a glass epoxy substrate, a ceramic substrate, a low temperature co-fired ceramic (LTCC) substrate, a polymer film, a glass substrate, a ceramic substrate or a combination thereof in another embodiment. The circuit 202 can be made with a plated metal, a metal foil or a thick film conductive paste in an embodiment.

A solder paste 203 is printed on the circuit 202 in an embodiment. The solder paste 203 typically comprises a solder powder and a flux. The solder powder is a metal alloy containing a metal having low melting point. The solder paste 203 comprises a solder powder selected from the group consisting of Sn/Pb, Sn/Pb/Bi, Sn/Sb, Sn/Cu, Sn/Ag/Cu, Sn/Zn/Bi, Sn/Zn/Al, Sn/Ag/In/Bi and Sn/Ag/Cu/Ni and a mixture thereof in an embodiment.

The solder paste 203 is lead-free in another embodiment. A lead-free solder is environment-friendly, however often causes less solderability compared to a lead-containing solder. The electric component of the present invention could have sufficient solderability even in use of a lead-free solder paste.

The solder paste is purchasable in the market, for example, Eco Solder® from Senju Metal Industry Co., Ltd., Evasol® from Ishikawa Metal Co., Ltd. and Fine Solder® from Matsuo Handa CO., Ltd.

The capacitor 100 is mounted on the solder paste 203 as the hot-melt polymer layers 105 come thereon as shown in FIG. 2.

The assembly is then reflowed. Heating may be accomplished by passing the assembly through a reflow oven or under an infrared lamp or by soldering individual joints with a hot air pencil.

During the reflow the solder could physically and electrically connect the terminal electrode 104 and the circuit 202. The reflow temperature is 100 to 350° C. in an embodiment, 150 to 310° C. in another embodiment, 200 to 290° C. in another embodiment. The reflow time is 1 to 60 second(s) in an embodiment, 4 to 30 seconds in another embodiment, and 6 to 20 seconds in another embodiment.

The heating temperature and time are adjustable in consideration of their combination such as low temperature for long time and high temperature for short time.

Figure 3:
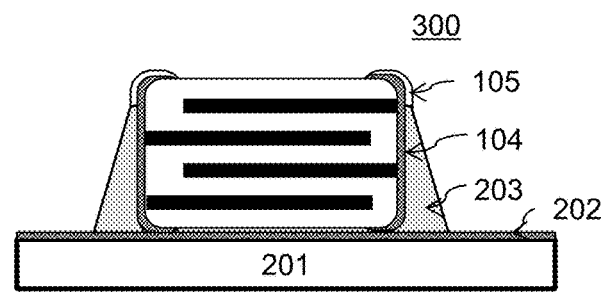
FIG. 3 is a schematic cross-sectional drawing for explaining the manufacturing method of an electrical device at the step of reflowing.

The solder paste 203 melts to spread out upward on the terminal electrodes 104 as fusing the hot-melt polymer layer during the reflow as shown in FIG. 3. The metal powder in the hot-melt polymer layer 105 could melt into an alloy with the molten solder 203. The polymer in the hot-melt polymer layer could move away as the molten solder spread out on the terminal electrode due to its higher specific gravity. The specific gravity of the solder is 7 to 10 g/cm$^3$ in an embodiment. The specific gravity of the polymer is 0.8 to 2.0 in an embodiment.

The electric component 100 can be a resistor, a capacitor, an inductor or a semiconductor in an embodiment.

The hot-melt polymer paste to form the hot-melt polymer layer is explained hereafter. The hot-melt polymer paste comprises (i) 100 parts by weight of a metal powder, (ii) 1 to 30 parts by weight of a polymer and (iii) a solvent.

(i) Metal Powder

The metal powder can be selected from the group consisting of silver, copper, gold, palladium, platinum, rhodium, nickel, aluminum, gallium, indium, tin, zinc, bismuth and a mixture thereof in an embodiment. The metal powder can be selected from the group consisting of silver, nickel, tin, zinc, bismuth and a mixture thereof in another embodiment. The metal powder can be silver in another embodiment.

The metal powder can be flaky, spherical, nodular or a mixture thereof in shape in an embodiment. The metal powder can be flaky in shape in another embodiment. The metal powder can be spherical in shape in another embodiment.

The particle diameter (D50) of the metal powder can be 0.5 to 20 μm in an embodiment, 0.7 to 15 μm in another embodiment, 0.9 to 10 μm in another embodiment, 1 to 5 μm in another embodiment, 0.5 to 2 μm in another embodiment, 3 to 5 μm in another embodiment. The metal powder with such particle size can disperse well in the organic vehicle. The particle diameter (D50) is obtained by measuring the distribution of the powder diameters by using a laser diffraction scattering method with Microtrac model X-100.

(ii) Polymer

The hot-melt polymer layer comprises a polymer in which the metal powder disperses. The polymer melts during the reflow. Melt mass-flow rate (MFR) of the polymer is 0.5 to 20 g/10 min. at 120 to 200° C. and 0.3 to 8 kgf. MFR of the polymer can be 0.8 to 15 g/10 min. in another embodiment, 1.0 to 10 g/10 min. in another embodiment at 120 to 200° C. and 0.3 to 8 kgf. Such polymer fluidizes at a high temperature. MFR is a measure of the ease of flow of a melted polymer. It is defined as the mass of polymer, in grams, flowing in ten minutes through a capillary of a specific diameter and length by a pressure applied via a gravimetric weight for a temperature. MFR can be measured according to JI57210 in an embodiment.

MFR can be measured at a temperature of 120 to 150° C. in another embodiment, 180 to 200° C. in another embodiment. MFR can be measured at a pressure of 0.5 to 2.5 kgf in another embodiment, 1.0 to 1.5 kgf in another embodiment, 3 to 7 kgf in another embodiment, 4 to 6 kgf in another embodiment.

MFR is 1 to 10 kgf in another embodiment, 2 to 8 in another embodiment, 2.5 to 7 in another embodiment and 2.5 to 4 in another embodiment at 130° C. and 5 kgf. MFR is 1 to 10 kgf in another embodiment, 5 to 10 in another embodiment, 7 to 9 in another embodiment and 8 to 10 in another embodiment at 190° C. and 1.2 kgf.

Melting point (Tm) of the polymer is 150 to 400° C. in an embodiment, 200 to 350° C. in another embodiment, 250 to 300° C. in another embodiment. The polymer turns to liquid at its melting point.

The polymer has glass transition point (Tg) of −25 to 180° C. in an embodiment. Tg of the polymer is 10 to 150° C. in another embodiment, 20 to 120° C. in another embodiment, 28 to 100° C. in another embodiment, 30 to 85° C. in another embodiment. The polymer starts alternating rigid crystalline and elastic amorphous regions at its glass transition point.

Molecular weight (Mw) of the polymer is 500 to 100,000 in an embodiment, 1000 to 80,000 in another embodiment, 2,000 to 50,000 in another embodiment, 3,000 to 25,000 in another embodiment, and 5,000 to 9,000 in another embodiment.

The polymer can be selected from the group consisting of polyester resin, phenoxy resin, novolac resin, epoxy resin, acrylic resin, melamine resin, polyimide resin, polyamide resin, polystyrene resin, butyral resin, cellulose resin, polyvinyl alcohol, polyurethane resin, silicone resin and a mixture thereof in an embodiment. The polymer can be selected from the group consisting of polyester resin, phenoxy resin, epoxy resin and a mixture thereof in another embodiment.

The polymer is 2 to 25 parts by weight in another embodiment, 3 to 20 parts by weight in another embodiment, 4 to 15 parts by weight in another embodiment, 6 to 13 parts by weight in another embodiment against 100 parts by weight of the metal powder.

The polymer can be thermoplastic in an embodiment. The hot-melt polymer paste comprises no thermosetting polymer in another embodiment.

(iii) Solvent

The solvent can be used to dissolves the polymer. The solvent evaporates during drying out the hot-melt polymer paste on the terminal electrode.

The solvent is 2 to 60 parts by weight in an embodiment, 9 to 50 parts by weight in another embodiment, 15 to 40 parts by weight in another embodiment against 100 parts by weight of the metal powder.

Boiling point of the solvent can be 120 to 350° C. in an embodiment, 160 to 320° C. in another embodiment, 200 to 290° C. in another embodiment.

The solvent can be an organic solvent in an embodiment.

The solvent can be selected from the group consisting of texanol, terpineol, carbitol acetate, ethylene glycol, butyl carbitol, dibutyl carbitol, dibuthyl acetate propylene glycol phenyl ether, ethylene glycol monobutyl ether and a mixture thereof in another embodiment.

An solvent can be used to adjust the viscosity of the hot-melt polymer paste to be preferable for applying on the substrate. Viscosity of the polymer paste is 10 to 300 Pa·s measured by Brookfield HBT with a spindle #14 at 10 rpm in an embodiment. In the event of dipping, the viscosity of the conductive paste can be 10 to 120 Pa·s.

(iv) Flux

The polymer paste can further comprise a flux. A flux could increase solderability of the terminal electrode by removing an inhibitor such as an oxidation on the surface of the soldering target. The polymer paste comprises 0.1 to 3 parts by weight of a flux in an embodiment, 0.4 to 2 parts by weight in another embodiment, 0.5 to 1.2 parts by weight in another embodiment. The flux remains in the hot-melt polymer layer after the reflow.

A flux can be purchasable in the market, for example, A0001 from Tokyo Chemical Industry Co., Ltd. and PO-F-1010S from Senju Metal Industry Co., Ltd.

(v) Additive

An additive such as a surfactant, a dispersing agent, a stabilizer and a plasticizer can be added to the polymer paste based on a desired property of the paste.

The hot-melt polymer paste comprises no glass frit in another embodiment.

The hot-melt polymer paste comprises no curing agent or cross-linking agent in another embodiment.

EXAMPLE

The present invention is illustrated by, but is not limited to, the following examples.

Example 1 and Comparative Example 1

The hot-melt polymer paste was prepared as follows.

100 parts by weight of a spherical silver powder and 10.5 parts by weight of a polyester polymer (MFR 6.59 g/10 min. at 130° C. and 5 kgf, Tg 36° C., Mw 16000, Nichigo-Polyester® TP249 from Nippon Synthetic Chemical Industry Co., Ltd.), dibutyl carbitol as a solvent and an additive were mixed well in a mixer followed by a three-roll mill until the metal powder was dispersed well. MFR was measured with method A by a melt indexer (D4003, Dynisco Corporate). The paste viscosity was adjusted by further adding the solvent to about 30 Pa·s measured by Brookfield HBT with a spindle #14 at 50 rpm. Particle diameter (D50) of the silver powder was 1.3 μm.

A chip inductor having terminal electrodes on both sides was prepared. The terminal electrodes were made by screen printing a heat-curable conductive paste followed by curing at 170° C. for 30 minutes. The electrode consisted of 91 wt. % of a copper powder and 9 wt. % of a phenolic resin. The terminal electrode was 40 μm thick.

The hot-melt polymer layer was formed on the terminal electrodes by dipping in the polymer paste prepared above. The applied polymer paste was dried at 120° C. for 30 minutes to be a hot-melt polymer layer of 10 μm thick.

A Pb-free solder paste (Sn/Ag/Cu=96.5/3/0.5, M705, Senju Metal Industry Co., Ltd.) was printed on a ceramic substrate. The printed pattern of the solder paste was two squares of 3 mm wide, 3 mm long and 250 μm thick. The chip inductor was mounted on the solder paste patterns as each terminal electrode and the hot-melt polymer layer came on the solder paste pattern followed by reflow at 260° C. for 10 seconds. For comparison, the chip inductor without hot-melt polymer layer was separately mounted on the solder paste (Comparative Example 1).

Figure 4:
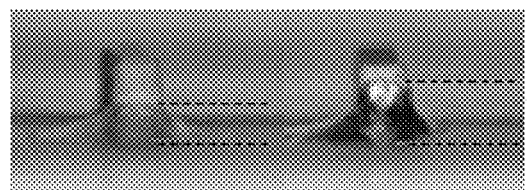
FIG. 4 is a result of reflowed soldering in Example 1 and Comparative Example 1.

The solder spread out upward more on the terminal electrode in Example 1 as shown in the right in FIG. 4 compared to the electric component without the hot-melt polymer layer in Comparative Example 1 as shown in the left in FIG. 4.

Example 2 to 7 and Comparative Example 2 to 3

The hot-melt polymer paste compositions were examined.

The hot-melt polymer pastes were prepared with the composition shown in Table 1. Particle diameter (D50) of the spherical and flaky silver powder was 1.3 μm and 4.0 μm respectively. The melt mass-flow rate (MFR), glass transition point (Tg) and molecular weight (Mw) of the polymer are shown below.

Phenoxy resin: MFR 1.17 g/10 min. at 190° C. and 1.2 kgf; Tg 92° C.; Mw 52,000.
Polyester resin A: MFR 6.59 g/10 min. at 130° C. and 5 kgf; Tg: 36° C.; Mw 16000.
Polyester resin B: MFR 8.68 g/10 min. at 190° C. and 1.2 kgf; Tg 65° C.; Mw 16000.
Epoxy resin: MFR 2.72 g/10 min. at 130° C. and 5 kgf; Tg 65° C.; Mw 7000.
Phenolic resin: Thermosetting polymer.

A ceramic substrate with a cured-type electrode formed thereon was prepared. The cured-type electrode was formed by screen printing the same heat-curable conductive paste as Example 1. Pattern of the cured-type electrode was a square of 25 mm long, 12 mm wide and 33 μm thick.

The hot-melt polymer paste prepared above was screen printed on the cured-type electrode. The printed hot-melt polymer paste was dried at 120° C. for 30 minutes, thereby the solvent in the paste being evaporated. The hot-melt polymer layer was a square of 25 mm long, 12 mm wide and 10 μm thick.

The same lead-free solder paste as Example 1 was screen printed on the hot-melt polymer layer. The solder paste pattern was a circle of 6 mm diameter and 250 μm thick.

The ceramic substrate with the layers of the electrode, the hot-melt paste and the solder paste was placed on a hot-plate to reflow at 260° C. for 10 seconds. During the reflow, the solder paste melted to spread out on the electrode.

After cooling down to room temperature, the solder spread ratio (%) was visually measured by observing the spread-solder area as follows, (reflowed solder area)/(printed-solder paste area)×100.

The solder spread ratio was over 100% in Example 2 to 7 where the hot-melt polymer layer was adopted. Meanwhile, the solder spread ratio was 100%, did not spread out at all in Comparative Example (Com. Ex.) 2 and 3 where the thermosetting polymer layer was formed.

TABLE 1

| | | Ex. 2 | Ex. 3 | Ex. 4 | Ex. 5 | Ex. 6 | Ex. 7 | Com. Ex. 2 | Com. Ex. 3 |
|---|---|---|---|---|---|---|---|---|---|
| | Polymer paste type | Hot-melt | Hot-melt | Hot-melt | Hot-melt | Hot-melt | Hot-melt | Thermo-setting | Thermo-setting |
| Metal powder | Spherical Ag powder | 100 | 100 | 100 | 100 | 100 | 0 | 100 | 100 |
| | Flaky Ag Powder | 0 | 0 | 0 | 0 | 0 | 100 | 0 | 0 |
| Polymer | Phenoxy resin[1] | 10.5 | 0 | 0 | 0 | 0 | 0 | 0 | 0 |
| | Polyester resin A[2] | 0 | 10.5 | 0 | 0 | 0 | 10.5 | 0 | 0 |
| | Polyester resin[3] | 0 | 0 | 10.5 | 10.5 | 0 | 0 | 0 | 0 |
| | Epoxy resin B[4] | 0 | 0 | 0 | 0 | 10.5 | 0 | 10.5 | 0 |
| | Phenolic resin[5] | 0 | 0 | 0 | 0 | 0 | 0 | 0 | 10.5 |
| | Solvent | 31.4 | 20.7 | 20.7 | 31.4 | 31.4 | 20.7 | 31.4 | 11.2 |
| | Hardener | 0 | 0 | 0 | 0 | 0 | 0 | 1 | 0 |
| | Flux[6] | 0 | 0 | 0 | 0.8 | 0 | 0 | 0 | 0 |
| | Solder spread ratio | 128% | 117% | 129% | 149% | 174% | 207% | 100% | 100% |

(Parts by weight)

[1] MFR 1.17 g/10 min. at 190° C. × 1.2 kgf; Tg 92° C.; Mw 52,000; PKHH from InChem Corp.
[2] MFR 6.59 g/10 min. at 130° C. × 5 kgf; Tg 36° C.; Mw 16000; Nichigo-Polyester ®, TP249 from Nippon Synthetic Chemical Industry Co., Ltd.
[3] MFR 8.68 g/10 min. at 190° C. × 1.2 kgf; Tg 65° C.; Mw 16000; Elitel ®, UE-3200G from UNITIKA Co., Ltd.
[4] MFR 2.72 g/10 min. at 130° C. × 5 kgf; Tg 65° C.; Mw 7000; Epotohto ®, YD-020G from NIPPON STEEL & SUMIKIN CHEMICAL Co., Ltd.
[5] Thermosetting polymer; RESITOP ®, PL5208 from Gunei Chemical Co., Ltd.
[6] A0001 from Tokyo Chemical Industry Co., Ltd.

What is claimed is:

1. A method of manufacturing of an electrical device comprising steps of:
   printing a solder paste on a circuit formed on a substrate;
   mounting an electric component on the applied solder paste,
   wherein the electric component comprises a main body, at least one terminal electrode on the main body and a hot-melt polymer layer formed on the terminal electrode, wherein the hot-melt polymer layer comprises (i) 100 parts by weight of a metal powder and (ii) 1 to 30 parts by weight of a polymer, wherein melt mass-flow rate (MFR) of the polymer is 0.5 to 20 g/10 min. at 120 to 200° C. and 0.3 to 8 kgf, wherein the hot-melt polymer layer comes on the applied solder paste;
   reflowing the electric component on the solder paste.

2. The method of claim 1, wherein the solder paste is lead-free.

3. The method of claim 1, wherein at least 70% of the surface of the terminal electrode is covered with the hot-melt polymer layer.

4. The method of claim 1, wherein the metal powder is flaky, spherical, nodular or a mixture thereof.

5. The method of claim 1, wherein particle diameter (D50) of the metal powder is 0.5 to 20 μm.

6. The method of claim 1, wherein the metal powder is selected from the group consisting of silver, copper, gold, palladium, platinum, rhodium, nickel, aluminum, gallium, indium, tin, zinc, bismuth and a mixture thereof.

7. The method of claim 1, wherein glass transition point (Tg) of the polymer is −25 to 180° C.

8. The method of claim 1, wherein molecular weight (Mw) of the polymer is 500 to 100,000.

9. The method of claim 1, wherein the hot-melt polymer layer further comprises 0.1 to 3 parts by weight of a flux.

10. The method of claim 1, wherein the polymer is selected from the group consisting of polyester resin, phenoxy resin, novolac resin, epoxy resin, acrylic resin, melamine resin, polyimide resin, polyamide resin, polystyrene resin, butyral resin, cellulose resin, polyvinyl alcohol, polyurethane resin, silicone resin and a mixture thereof.

11. The method of claim 1, wherein the electric component is a resistor, a capacitor, an inductor or a semiconductor chip.

12. The method of claim 1, wherein the reflow temperature is 100 to 350° C.

* * * * *